(12) United States Patent
Cruz (10) Patent No.: US 8,592,963 B2
(45) Date of Patent: Nov. 26, 2013

(54) SELF-ALIGNING STRUCTURES AND METHOD FOR INTEGRATED CHIPS

(75) Inventor: Randolph Cruz, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 288 days.

(21) Appl. No.: 13/251,846

(22) Filed: Oct. 3, 2011

(65) Prior Publication Data

US 2012/0032317 A1    Feb. 9, 2012

Related U.S. Application Data

(60) Division of application No. 12/252,332, filed on Oct. 15, 2008, now Pat. No. 8,035,206, which is a continuation-in-part of application No. 12/250,525, filed on Oct. 13, 2008, now Pat. No. 8,035,221.

(60) Provisional application No. 60/990,280, filed on Nov. 26, 2007, provisional application No. 60/986,579, filed on Nov. 8, 2007.

(51) Int. Cl.
   *H01L 23/495* (2006.01)

(52) U.S. Cl.
   USPC ............... 257/676; 257/E21.505; 257/690; 438/123

(58) Field of Classification Search
   USPC ........... 257/E23.031, E21.506, E21.001, 676, 257/690, 691, 704, 706, 707, 710, 726, 727, 257/778, 779; 438/106, 121, 123, 661; 174/263
   See application file for complete search history.

(56) References Cited

U.S. PATENT DOCUMENTS

| | | | |
|---|---|---|---|
| 6,459,147 B1 * | 10/2002 | Crowley et al. ............... | 257/692 |
| 6,747,360 B2 * | 6/2004 | Fukuizumi et al. ........... | 257/783 |
| 6,777,800 B2 * | 8/2004 | Madrid et al. ................ | 257/690 |
| 7,238,551 B2 * | 7/2007 | Kasem et al. ................. | 438/123 |
| 7,271,470 B1 * | 9/2007 | Otremba ....................... | 257/666 |
| 8,304,903 B2 * | 11/2012 | Herbsommer et al. ....... | 257/736 |
| 8,519,525 B2 * | 8/2013 | Xue et al. ...................... | 257/692 |
| 2006/0108671 A1 * | 5/2006 | Kasem et al. ................. | 257/676 |

* cited by examiner

*Primary Examiner* — Chris Chu
(74) *Attorney, Agent, or Firm* — Wallace G. Walter (57) ABSTRACT

A lead frame having a die thereon connects a conductive area on the die to a lead frame contact using a conductive clip that includes a structural portion that is received with a recess-like "tub" formed in the lead frame contact. The end of the clip received in the tub is held in place during subsequent handling by a solder paste deposit until the clip and leadframe undergo solder reflow to effect a reliable electrical connection. The effective surface area between one side of the clip and the other side of the clip within the tub is different so that the surface tension of the liquefied solder formed during the solder reflow step will "draw" the clip into a preferred alignment against a "stop" surface.

13 Claims, 7 Drawing Sheets

SELF-ALIGNING STRUCTURES AND METHOD FOR INTEGRATED CHIPS

CROSS-REFERENCE TO RELATED APPLICATION

This patent application is a divisional of U.S. patent application Ser. No. 12/252,332 filed Oct. 15, 2008 (now U.S. Pat. No. 8,035,206 issued Oct. 11, 2011) and claims the benefit of commonly owned U.S. Provisional Patent Application No. 60/990,280 filed Nov. 26, 2007 by the inventor herein and entitled "Self-Aligning Structures for Integrated Circuits" and the benefit of commonly owned U.S. Provisional Patent Application 60/986,579 filed Nov. 8, 2007 by the inventor herein and entitled "Clip Mount For Integrated Circuit Leadframes," the respective disclosures of which are incorporated herein by reference. The disclosure of the present application is related to the disclosure of commonly owned U.S. patent application No. 12/250,525 filed Oct. 13, 2008 by the inventor herein and entitled "Clip Mount For Integrated Circuit Leadframes" (now U.S. Patent 8,035,221 issued Oct. 11, 2011).

BACKGROUND OF THE INVENTION

The present invention relates to the improved placement and self-alignment of structures associated with an integrated circuit and, more particularly, to structures, including mechanical and electrical connection structures, designed to self-align into their as-designed orientation during the solder-reflow phase of their assembly.

In the packaging of integrated circuits, the "chip" or die is typically attached to the die "paddle" or "pad" portion of a leadframe structure by a die-attach material, typically a solder paste created as a mixture of solder particles and a flux-containing gel. During the assembly process, the solder paste acts as a temporary adhesive that holds the die to the leadframe while the parts are heated during a subsequent solder reflow process step in which the solder paste is thermally liquefied and thereafter solidified to secure the die and leadframe together.

The die includes contact pads that are electrically connected to respective leads or contact areas on the leadframe by thin bonding-wires using ball bond (i.e., "nail-head") or wedge bond formations and thermocompressive or thermosonic bonding techniques.

In some applications involving higher than usual currents, a plurality of bonding wires can be used to connect various conductive pads on the die to leads, pads, or areas on the leadframe to accommodate the current involved. As the current levels increase, the number of bonding wire connections increases to the point where the use of a sufficient plurality of bonding wires to carry the current load becomes impracticable. Rather than use a multitude of bonding wires in high-current applications, such as those involving power-switching or power-handling transistors, connections can be made from the die to the leadframe via a conductive ribbon or pre-formed clips fabricated from copper or a copper alloy, for example, as the conductive material.

In those cases where a pre-formed clip is used, the clip is typically placed on the die/leadframe assembly by a robotic 'pick-and-place' machine and maintained in position by a quantity of solder paste. As occasionally happens, the clip is mis-aligned during placement; in some cases the mis-aligned clip can contribute to product reliability issues. Additionally, parts and structures undergoing solder reflow have been know to "swim" or "move around" on the liquefied solder as a consequence of differential heating rates and to thereby lose their as-placed alignment.

SUMMARY

A clip structure is mounted to a leadframe using a "tub" or trench-like formation that is formed in the leadframe material and shaped to receive or accept the geometric shape of the clip at the end thereof that connects to the leadframe. In the preferred embodiment, a leadframe structure is fabricated by etching with at least one portion thereof including a half-etch recess or tub or trench that receives one end of the clip structure and is temporarily retained in the tub by a selected quantity of solder paste or equivalent material. The end of the clip that is received in the tub is thus held in place in the x,y,z planes during subsequent handling until the clip and leadframe undergo solder reflow to effect an electrical connection and a corresponding mechanical connection. The tub and/or the clip include recesses or pockets that increase the wettable surface area on one side of the clip relative to the other side thereof. During the solder reflow step, the liquefied solder wets the increase surface area side of the clip with the tendency of liquid or molten solder to minimize its surface area causing the parts to draw to and toward their final as-designed alignment.

Preferably, the solder-containing pocket or pockets are formed as recesses in one and or both of the tub wall and that portion of the clip received therein so that the solder, as it undergoes liquefaction during the solder reflow step, will pull the parts undergoing soldering into their as-designed orientation.

DESCRIPTION OF THE PREFERRED EMBODIMENTS

Figure 1:
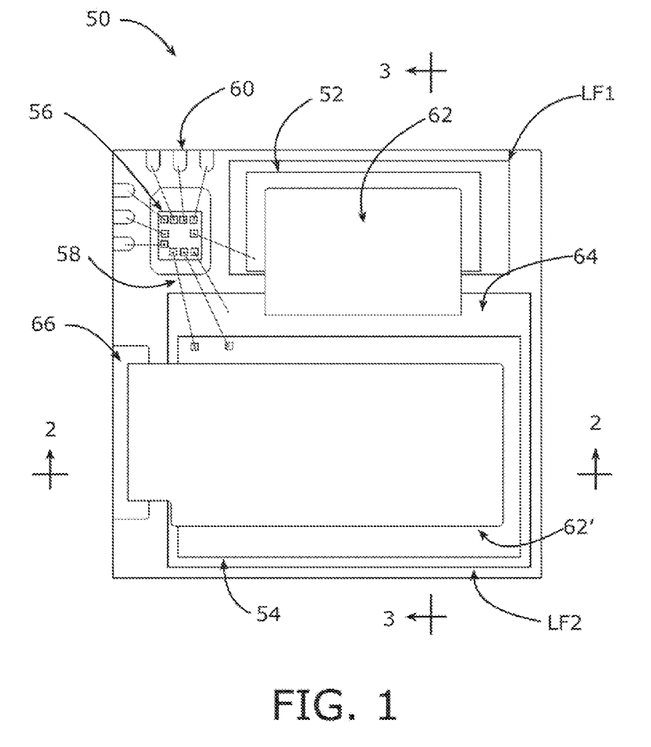
FIG. 1 is a plan view of an example embodiment of a representative two field effect transistor (FET) integrated circuit structure.
Figure 2:
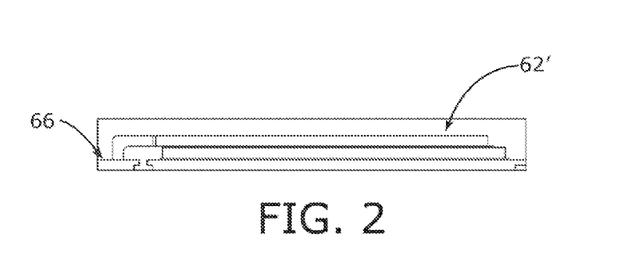
FIG. 2 is a side elevational view of the structure of FIG. 1 taken along line 2-2 of FIG. 1.
Figure 3:
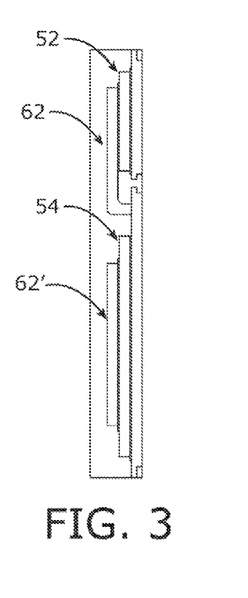
FIG. 3 is a end view of the structure of FIG. 1 taken along line 3-3 of FIG. 1.

FIGS. 1-3 illustrate an example circuit assembly, designated generally by the reference character 50, and shows first and second FETs 52 and 54 mounted atop respective leadframes LF1 and LF2. A controller or driver chip 56 is connected via bonding wires 58 between conductive pads (unnumbered) on the driver chip 56 to contacts 60 and via bonding wires 58 connected to selected portions of the FETs 52 and 54. While each FET 52/54 is mounted on a respective leadframe LF1/LF2 in FIG. 1a, both respective leadframes constitute a leadframe collectively for the assembly.

As shown, a conductive first clip 62 (typically fabricated from copper or a copper alloy) is connected between the top surface of the FET 52 and a surface portion 64 of the leadframe LF2 and second conductive clip 62' is connected between the top surface of the FET 54 and another portion 66 of the leadframe.

As shown in FIGS. 2 and 3, the clips 62 and 62' are fabricated as generally "L" shaped members with an upstanding columnar portion and a cantilevered portion that extends to the contact surface of the respective FET. The clips are typically fabricated from copper or a copper alloy.

In the organization of FIGS. 1-3 and during the assembly thereof, solder paste deposits are placed on the surface of the leadframe in areas 64 and 66 upon which the columnar portions of the clips 62 and 62' will be placed. Thereafter, the clips 62 and 62' are positioned in place (typically by a robotic 'pick-and-place' machine) with the previously deposited solder paste. In general, solder pastes are a mixture of solder particles and a gel-like flux to provide a material having an adhesive, adherent, or tacky quality sufficient to hold the parts in their as-placed positions during subsequent process steps. The solder particles contain varying percentages of lead and tin and other metals, although more recent solder alloys contain very small amounts of lead or are lead-free.

Figure 4:
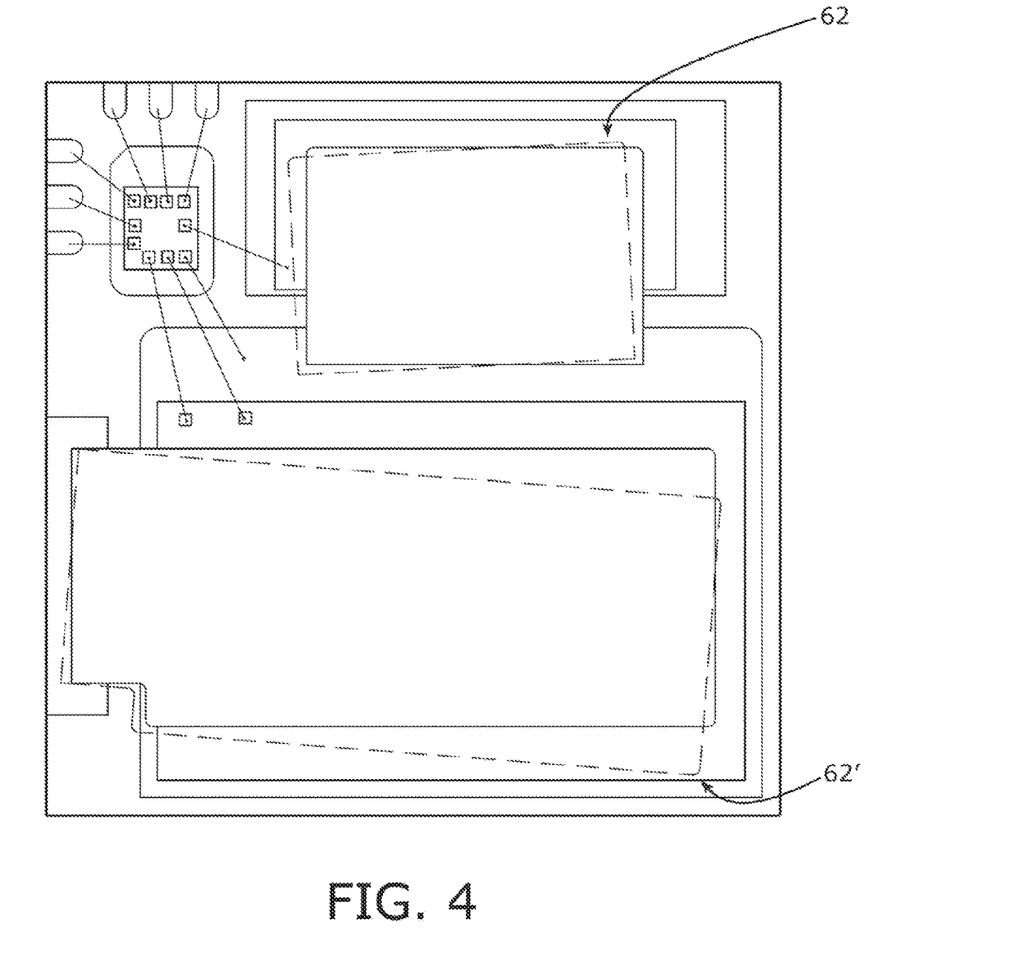
FIG. 4 is a plan view of the example embodiment of FIG. 1 with selected components mis-aligned.

When the assembly undergoes the solder reflow step, the solder paste is heated until it momentarily liquefies and is thereafter cooled to complete the solder reflow step. It is known that parts undergoing solder reflow can 'swim' or 'float' on the liquefied solder and, occasionally, become mis-aligned to result in mis-aligned parts as represented by the dotted-line clips 62 and 62' in FIG. 4.

As explained below, parts that are liable to mis-alignment during the solder reflow step are mounted in "tubs" or trench-like recesses to hold them in alignment during the solder reflow step with solder-retaining tubs designed to cause the part or parts to undergo self-alignment during the solder reflow step as a consequence of the tendency of molten solder to reduce its surface area.

Figure 5:
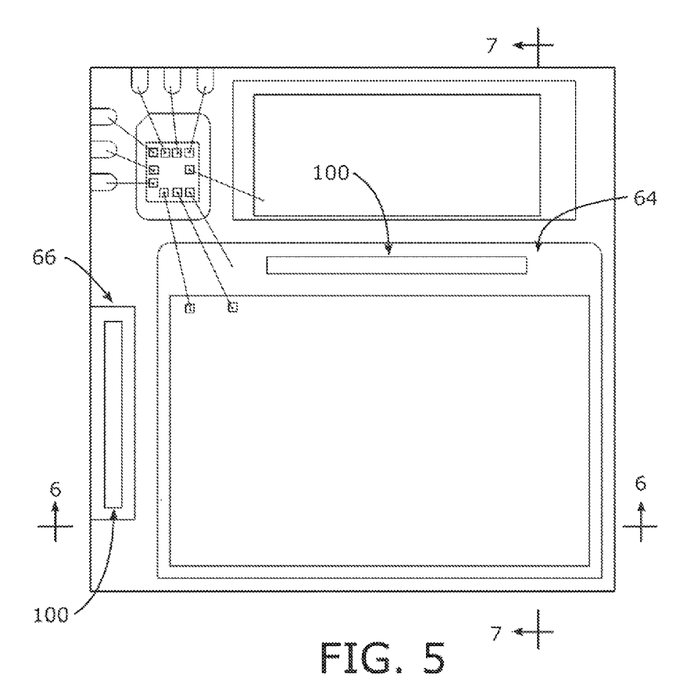
FIG. 5 is a plan view of the leadframe assembly of FIG. 1 having "tub" portions formed therein with selected components thereof omitted for reasons of clarity.
Figure 6:
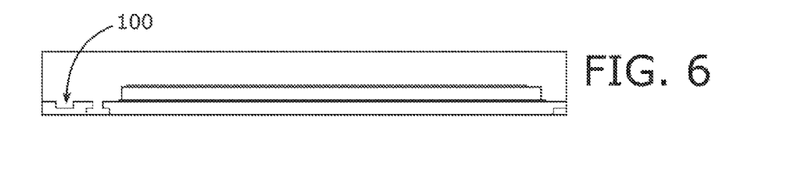
FIG. 6 is a side elevational view of the structure of FIG. 5 taken along line 6-6 of FIG. 5.
Figure 7:
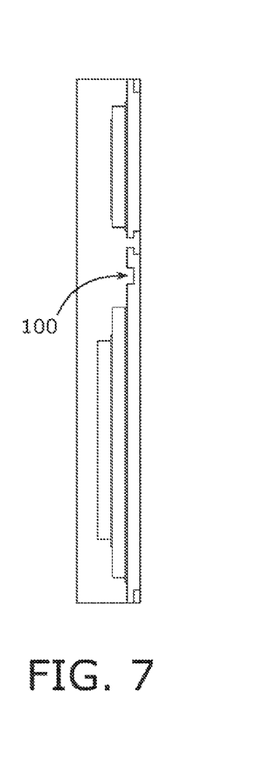
FIG. 7 is an end elevational view of the structure of FIG. 5 taken along line 7-7 of FIG. 5.

FIGS. 5-7 illustrates the organization of FIGS. 1-3 in which the clips 62 and 62' are not shown for reasons of clarity and illustrating "tubs" 100 formed in the areas 64 and 66. In general, the tubs 100 are formed as trench-like recesses designed to accept and align the lower end of the columnar portion of each conductive clip 62 and 62'. Since the leadframes are typically formed by etching, the tub 100 or tubs 100 can be readily formed as a "half-etch" step within the leadframe process; for leadframes having a thickness of about 8 mils (0.008 inch), a half-etch tub depth of about 4 mils (0.004 inch) is considered typical.

Figure 8:
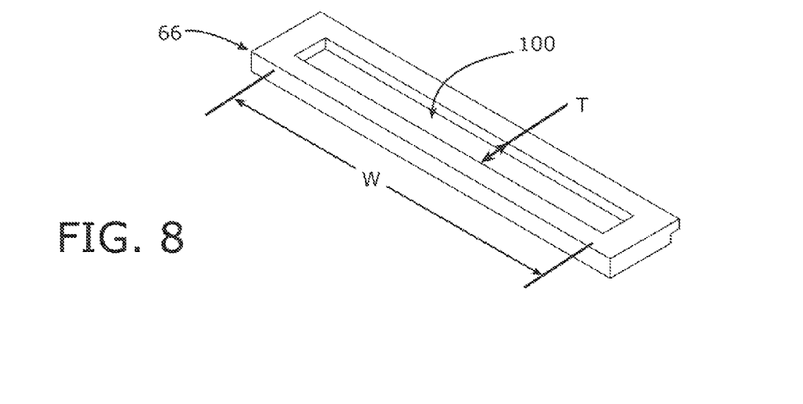
FIG. 8 is an isometric detail view of that portion of the leadframe of FIGS. 5-7 having the "tub" formation.

As shown in the isometric detail of FIG. 8, the tub 100 is shown as an approximate or general parallelepiped or prismatic form having a side-to-side width W and an across the tub dimension T as described in the above-incorporated U.S. Provisional Patent Application 60/986,579 filed Nov. 8, 2007 by the inventor herein. In the various figures, the tub 100 is shown in a geometrically idealized form with straight lines that intersect at edges to define flat parallel planes and to define corners and vertices without substantial radii; in practice, the tub, which can also be characterized as a pocket, groove, recess, or trench, differs from the idealized form shown depending upon the manufacturing process and design constraints. As explained in relationship to FIGS. 9-19, the tub 100 is also provided with pockets or recesses on one side thereof to increase the surface area of that one side for accommodating solder to cause or promote self-alignment during the solder reflow step as a consequence of the tendency of molten solder to reduce its surface area.

Figure 9:
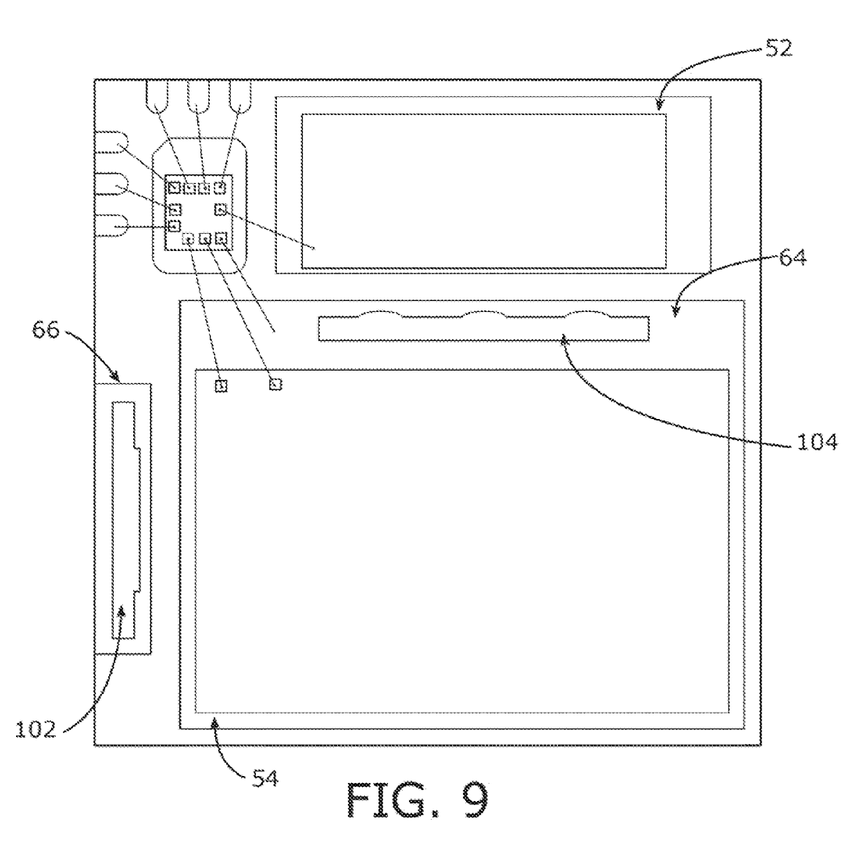
FIG. 9 is a plan view of the leadframe assembly of FIG. 6 in which the "tub" portions are formed with solder 'pockets' to assist in the self-alignment of selected parts during the solder reflow step.
Figure 10:
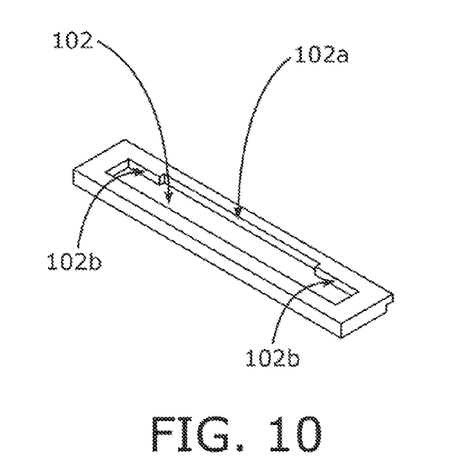
FIG. 10 is a detailed perspective view of one of the example tub formations of FIG. 9.
Figure 11:
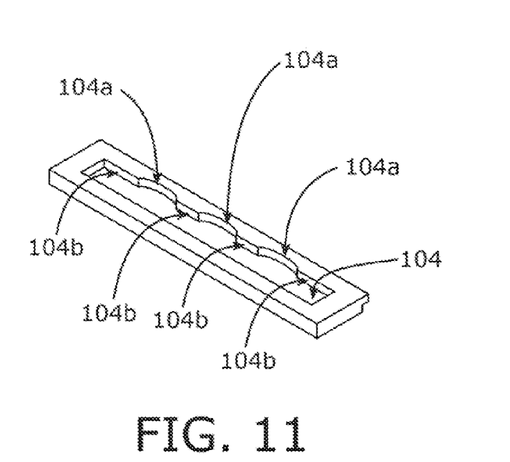
FIG. 11 is a detailed perspective view of another of the example tub formations of FIG. 9.

FIGS. 9-11 illustrates the organization of FIGS. 5-7 in which the clips 62 and 62' are not shown for reasons of clarity and illustrating "tubs" 102 and 104 formed in the areas 64 and 66. In both FIGS. 10 and 11, the tubs 102 and 104 have the same general planform as the tub 100 shown in FIG. 8 but are provided with solder-retaining pockets or recesses that are intended to increase the surface area on the side those having those pockets or recesses, as explained below. In the case of FIG. 10, the tub 102 includes a pocket or recess 102a that is not as long as the tub 102 to define dimensional reference or "stop" surfaces 102b on either side thereof. While only one recess 102a is shown in FIG. 10, a plurality of spaced recesses 102a can also be used. In the case of FIG. 11, the tub 104 includes three spaced curvilinear pockets or recesses 104a that also define dimensional reference or "stop" surfaces 104b on either side thereof. Since the curvilinear recesses 104a are spaced apart from one another, stop surfaces 104b are also defined intermediate the recesses 104a.

When viewed in planform and as explained below, the presence of the pockets or recesses on one side of the long axis of the tub increases the surface area on the one side of the tub available to be wetted by the solder during the solder reflow step relative to the surface area available on the other side of the tub; this surface area asymmetry functions to create the self-alignment function discussed below.

The configurations of FIGS. 10-11 are examples only and are representative of a wider variety of pocket configurations that create a surface-area asymmetry about the long axis of the tub. While FIG. 9 shows the use of two different pocket configurations, a single pocket configuration for all tub in a chip assembly is also contemplated.

Figure 12:
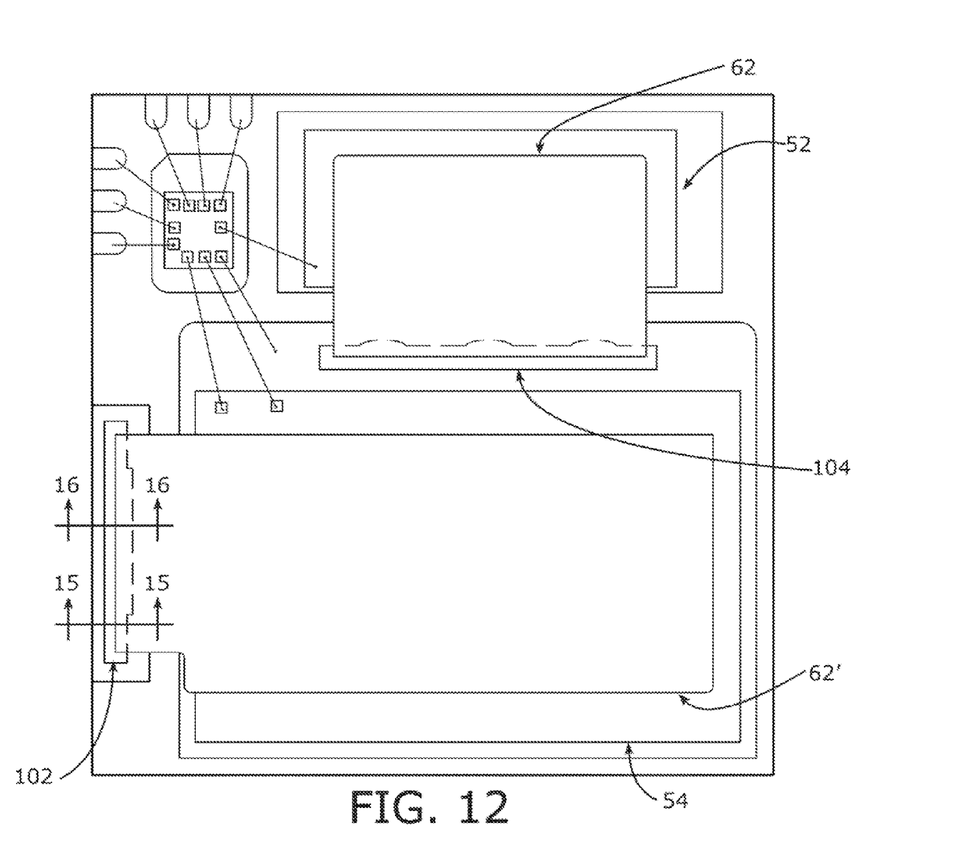
FIG. 12 is a plan view of the leadframe assembly of FIG. 9 subsequent to the solder reflow step in which the various parts are in their final as-designed alignment.

FIG. 12 illustrates the organization of FIG. 9 with clips 62 and 62' in place in which the end of the columnar portion of each clip is retained in its respective tub (104, 102) to provide alignment of the clips 62 and 62' relative to their respective FETs.

Figure 13:
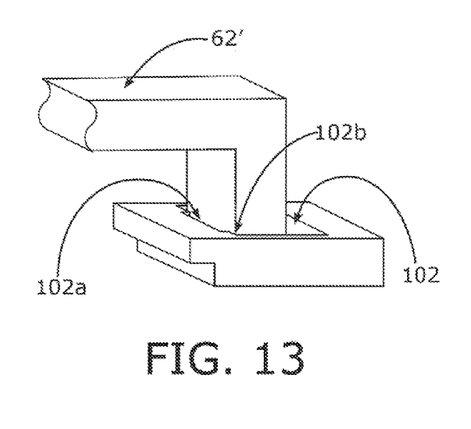
FIG. 13 is a detailed isometric view of a portion of a conductive clip installed within its tub, the tub having a first configuration.
Figure 14:
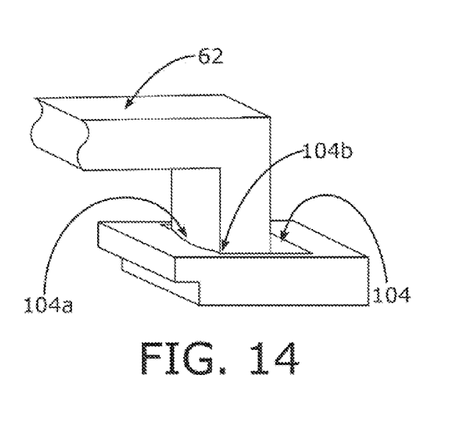
FIG. 14 is a detailed isometric view of a portion of a conductive clip installed within its tub, the tub having a second configuration.

FIG. 13 is a generalized isometric detail of the tub 102 and its clip 62' showing the columnar end of the clip 62' against the stop surfaces 102b. In a similar manner, FIG. 14 is a generalized isometric detail of the tub 104 and its clip 62 showing the columnar end of the clip 62 against its stop surfaces 104b. The tub 104 in FIG. 14 is show only one curvilinear pocket 104a (in contrast to FIG. 11) to shown yet another pocket variation.

In practice, the example circuit assembly 50 is assembled with solder paste deposited into the tubs on or toward the sides thereof having the pocket formations so that the pocket or each pocket preferably contains some solder paste; solder paste is also deposited on the bottom of the respective tub or tubs in that area that will be contacted by the bottom of the columnar portions of the clips 62 and 62'. If desired, additional and sufficient solder paste can be deposited into the tub to partially fill the tub, although filling the tub to point where some of the solder can spill-over after the completion of the solder reflow step should be avoided. Thereafter, the clip or clips are placed in position by a pick-and-placed machine that positions the columnar portion of the clips into the respective tubs with the solder paste functioning as a temporary adhesive. It is contemplated that the placement of the clips will also cause some spreading or extrusion of the pre-placed solder paste deposits into any available clearance spaces in the general area or vicinity of the columnar portion of the clips.

While it is preferable to deposit the solder paste into the tub prior to insertion of the clip, depositing solder paste on that portion of the clip to-be-received in the tub is not excluded and depositing solder both into the tub and onto the clip prior to insertion of the clip is not excluded.

During the solder reflow step, the solder paste is heated to liquefaction during which time the now fluid solder will "wet" surfaces of the tub and the columnar end of the clip structure. The "wetted" areas will generally correspond to those surface areas in which the solder paste was initially deposited as well as those areas onto which the solder paste spread or extruded during placement of the clip as well as those areas that are treated or activated by the heated flux as liquefaction occurs.

When viewed in planform, the presence of the solder pockets or recesses effectively increases the wettable surface area on that side of the tub that includes the pockets or recesses in contrast to the wettable surface area on the other side of the tub that does not include the solder pockets; thus, the solder pockets create a surface area asymmetry about the long axis of the tub. As the solder is liquefied during the solder reflow step, a larger wettable area is available to be wetted and is wetted by the liquid solder on the side of the tub having the solder pocket or pockets. It is known that the surface tension of liquid solder is such that small parts, such as surface mount components, to be "drawn" in a preferred direction as a function of the wetted surface area.

Figure 15:
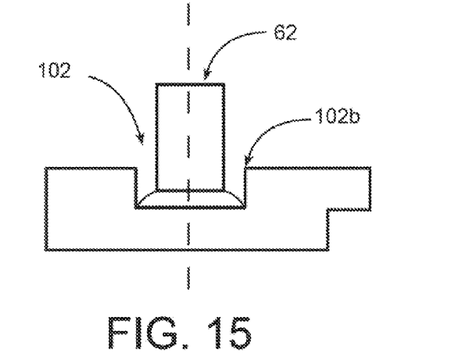
FIGS. 15 and 16 are detail cross-sectional views of a tub taken along lines 15-15 and 16-16, respectively, of FIG. 12.

FIG. 15 is a cross-section through the tub 102 taken along line 15-15 of FIG. 12 and shows the columnar end of the clip in the tub 102 between the stop surface 102b (on the right) and the opposite surface of the tub (on the left). In this particular area of the tub, the surface area about the medial axis (dotted-line) can be viewed as symmetrical with approximately equal surface areas on the opposite sides of the axis available for wetting. In the FIG. 15 context, any leftward and rightward forces consequent to the liquid solder will tend to be substantially equal with little or no net force to cause the clip to change position.

Figure 16:
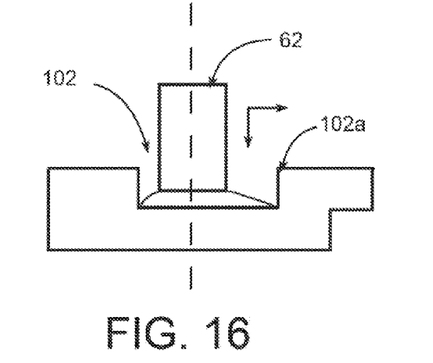

FIG. 16 is a cross-section through the tub 102 taken along line 16-16 of FIG. 12 and shows the columnar end of the clip 62 in the tub between the surface 102a that defines the recess or pocket (on the right) and the opposite surface of the tub (on the left). In this particular area of the tub, the surface area about the medial axis (dotted-line) can be viewed as asymmetrical with more surface area on the right side of the axis available for wetting. In the FIG. 16 context, any leftward and rightward forces consequent to the liquid solder will tend to be substantially unequal with the rightward force being somewhat greater than the leftward force to provide a net rightward force. Additionally, a downward force will be exerted to pull the clip downward into the tub.

During the solder reflow step and once the solder is liquefied, the now-liquid solder will wet a proportionately larger surface area on the right side of the medial axis in that portion of the tub 102 having the pockets or recesses (FIG. 16) than available in the end portions of the tub 102 having only the stop surfaces 102b (FIG. 15). As a consequence, unbalance forces (represented by the vectors in FIG. 16) will have a tendency to pull or "draw" the clip 62 to the right in FIG. 16 until the clip 62 engages the stop surfaces 102b to contribute to self-alignment. Further, additional "draw" forces are developed as a consequence of the surface tension of molten solder; the surface tension causes the now larger volume of solder on the right side of the medial axis to assume a minimum surface area. In the context of FIG. 16, the liquefied solder volume in the solder-wetted pocket(s) of the tub formation and the solder-wetted surfaces of the columnar portion of the clip will be subject to forces to draw the parts together until the dimensional reference "stop" surfaces contact the facing surfaces of the columnar portion of the clip to also contribute to self-alignment.

In those cases were the clip is properly aligned during placement and maintains that alignment during the solder reflow step, the "drawing" together forces described above exerted by the liquid solder will hold the parts together during the reflow step and subsequent solidification. However and in those cases where the clip is mis-aligned during placement or becomes mis-aligned after placement, the "drawing" together forces exerted by the liquid solder during the solder reflow step will move the clip into alignment against the stop surfaces and hold the parts together throughout the reflow step and subsequent solidification.

Figure 17:
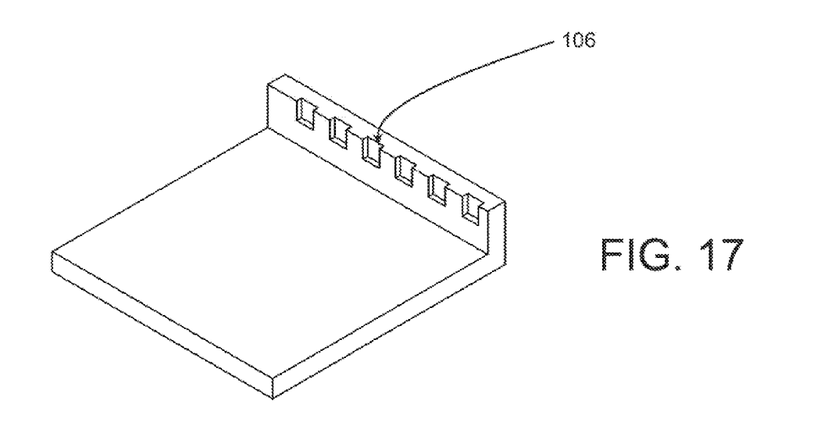
FIGS. 17 and 18 illustrate another configuration of the tub and clip assembly.
Figure 18:
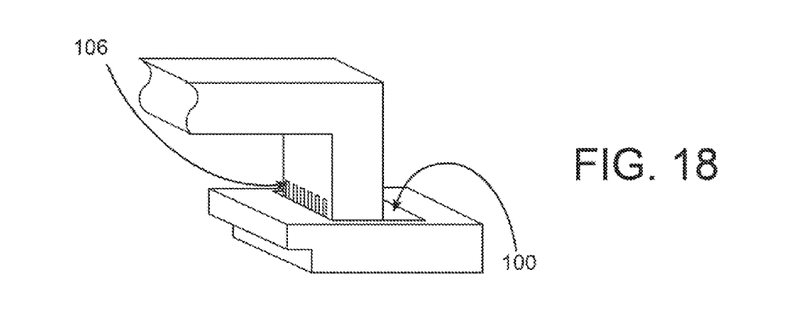

In the embodiments described above, the solder pockets are formed in or as extensions of the tub formation to asymmetrically increase the wettable surface area on one side of the medial axis of the tub; it is contemplated that solder pockets can also be formed in the columnar end of the clip structure. For example and as shown in FIG. 17, a series of recess-like pockets 106 can be formed in columnar end of the clip structure on the side thereof that faces the reference or stop surfaces. As shown in FIG. 18, the columnar end of the clip structure is placed in a tub 100 of the configuration shown in FIG. 8; in this case, the volume of liquefied solder wetting the surfaces of the pocket and the corresponding surfaces of the tub 100 will function to maintain alignment of a properly placed clip or "draw" a mis-aligned clip into position during the solder reflow step.

Figure 19:
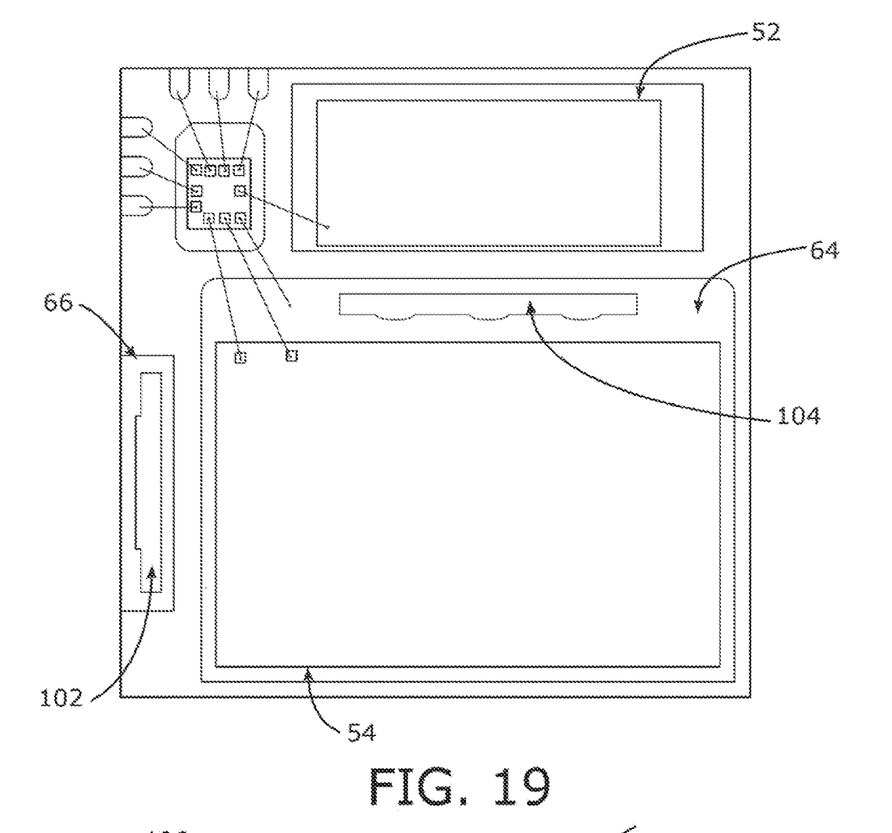
FIG. 19 illustrates a variation of the configuration of FIG. 9.
Figure 20:
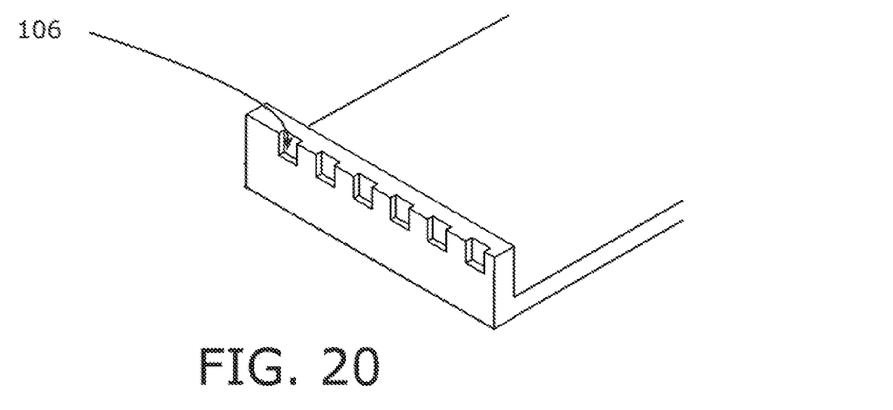
FIG. 20 illustrates a variation of the configuration of FIG. 17.

In the embodiments described above, the surface area increasing features (pockets, recesses, notches, etc.) on the tub wall and/or the lower end of the columnar portion of the clip are designed to "draw" the clip in the general direction of and toward the FET until the stop surfaces engage to cause the clip to move into proper alignment. As shown in FIG. 19, the surface area increasing features (pockets, recesses, notches, etc.) can be placed on opposite tub wall from that shown and discussed above and/or, as shown in FIG. 20, on the other side of the lower end of the columnar portion of the clip to "draw" the clip away from the FET until the stop surfaces on the opposite side of the tub engage to cause the clip to move into proper alignment.

As will be apparent to those skilled in the art, various changes and modifications may be made to the illustrated embodiment of the present invention without departing from the spirit and scope of the invention as determined in the appended claims and their legal equivalent.

The invention claimed is:

1. A structural organization for electrically connecting a portion of a semiconductor die to an electrical contact portion of a leadframe, comprising:
   a leadframe having a die attached thereto and having a plurality of electrical contacts associated therewith, at least one of said contacts of said leadframe having a thickness dimension associated therewith and having a recess-like tub formed therein, said tub having first and second opposed wall surfaces, one of said wall surfaces having a larger surface area than the other wall surface; and
   an electrically conductive clip having first and second portions, a one of said first and second portions electrically connected to a portion of the die and the other of said first and second portions received within said tub and mechanically secured therein by a solder.

2. The structural organization of claim 1, wherein said larger surface area wall surface of said tub includes at least one recess or pocket formed therein.

3. The structural organization of claim 2, wherein said a columnar part has a width dimension W' and a thickness dimension T' and said tub has a dimension W corresponding to and larger than said width dimension W' and a dimension corresponding to and larger said thickness dimension T'.

4. The structural organization of claim 2, wherein said electrically conductive clip includes a bridge part connected to said columnar part, the bridge part connected to said die.

5. The structural organization of claim 1, wherein said electrically conductive clip includes a columnar part received within the tub.

6. The structural organization of claim 5, wherein said columnar part received within the tub includes first and second surfaces, the first surface opposite said first wall surface of said tub and the second surface opposite said second wall surface of said tub, the surface opposite said larger surface area wall surface having a larger surface area than said other surface.

7. The structural organization of claim 1, wherein said tub has a depth dimension about one-half the thickness of the leadframe.

8. A structural organization for electrically connecting a portion of a semiconductor die to an electrical contact portion of a leadframe, comprising:
   a leadframe having a die attached thereto and having a plurality of electrical contacts associated therewith, at least one of said contacts of said leadframe having a thickness dimension associated therewith and having a recess-like tub formed therein, said tub having first and second opposed wall surfaces; and
   an electrically conductive clip having a first and a second portion, said first portion received within said tub and mechanically secured therein by a solder, said first portion having at least a first surface opposite the first wall surface of the tub and having a second surface opposite the second wall surface of said tub, one of said first and second surfaces having a larger surface area than the other said one of said first and second surfaces, said second portion of said clip electrically connected to a portion of the die.

9. The structural organization of claim 8, wherein the wall surface of said tub opposite said larger surface area surface of said clip has a larger surface area than the other wall surface of said tub.

10. A structural organization for electrically interconnecting a portion of a first semiconductor die to a leadframe electrically connected to a second portion of a second semiconductor die, comprising:
    a first leadframe having a first die attached thereto and having a plurality of electrical contacts associated therewith,
    a second leadframe having a second die attached thereto and having a plurality of electrical contacts associated therewith, said second leadframe having a thickness dimension associated therewith and having a recess-like tub formed therein, said tub having first and second opposed wall surfaces, one of said wall surfaces having a larger surface area than the other wall surface; and
    an electrically conductive clip having first and second portions, a one of said first and second portions electrically connected to a portion of the first die and the other of said first and second portions mechanically received within said tub of said second leadframe.

11. The structural organization of claim 10, wherein said electrically conductive clip includes a columnar part received within the tub.

12. The structural organization of claim 11, wherein said a columnar part has a width dimension W' and a thickness dimension T' and said tub has a dimension W corresponding to and larger than said width dimension W' and a dimension corresponding to and larger said thickness dimension T'.

13. The structural organization of claim 10, wherein said tub has a depth dimension about one-half the thickness of the leadframe.

* * * * *